(12) United States Patent
Krause

(10) Patent No.: US 6,581,171 B1
(45) Date of Patent: Jun. 17, 2003

(54) CIRCUIT CONFIGURATION FOR THE BURN-IN TEST OF A SEMICONDUCTOR MODULE

(75) Inventor: Gunnar Krause, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/550,212

(22) Filed: Apr. 17, 2000

(30) Foreign Application Priority Data

Apr. 16, 1999 (DE) .......................................... 199 17 336

(51) Int. Cl.$^7$ ............................................. G11C 29/00
(52) U.S. Cl. ...................................................... 714/718
(58) Field of Search ........................ 257/529; 327/525; 324/760, 765; 326/46; 714/718, 45, 724, 723, 736, 733, 734, 735, 737, 738, 726, 30

(56) References Cited

U.S. PATENT DOCUMENTS

| | | | |
|---|---|---|---|
| 5,303,246 A | * | 4/1994 | Anderson et al. ........... 714/727 |
| 5,313,424 A | * | 5/1994 | Adams et al. ............... 365/200 |
| 5,732,209 A | * | 3/1998 | Vigil et al. .................... 714/30 |
| 5,794,175 A | * | 8/1998 | Conner ........................ 702/119 |
| 6,055,657 A | * | 4/2000 | Heo et al. .................... 714/724 |

FOREIGN PATENT DOCUMENTS

| | | |
|---|---|---|
| DE | 43 21 211 C2 | 1/1994 |
| DE | 195 08 680 C2 | 10/1995 |
| DE | 43 21 211 C2 | 9/1996 |
| DE | 195 08 680 C2 | 3/1997 |
| DE | 690 31 551 T2 | 2/1998 |
| DE | 198 52 429 C1 | 11/2000 |
| EP | 0 408 299 B1 | 1/1991 |
| JP | 7-27827 | 1/1995 |
| JP | 11-44739 | 2/1999 |
| KR | 1998-043517 | 9/1998 |

* cited by examiner

*Primary Examiner*—Albert Decady
*Assistant Examiner*—Guy Lamarre
(74) *Attorney, Agent, or Firm*—Laurence A. Greenberg; Werner H. Stemer; Ralph E. Locher

(57) ABSTRACT

A circuit for the burn-in test of a semiconductor module, to which burn-in test signals from a burn-in test device can be applied, has memory elements. Each burn-in test signal is assigned at least one memory element, for storage of the respective burn-in test signal that is present. The memory elements are connected to a functional unit, which, through of a corresponding state, indicates whether one of the test signals has been contact-connected defectively. In a further section, the circuit configuration furthermore comprises a test device for checking the functionality of the semiconductor module, and a storage device for storing test results using a pass-fail result. A first programmable element and a second programmable element are provided, for storage of the pass-fail results and of the state of the functional unit. The programmable elements each maintain their stored state after an interruption in the voltage supply and can subsequently be evaluated using their state.

10 Claims, 3 Drawing Sheets

CIRCUIT CONFIGURATION FOR THE BURN-IN TEST OF A SEMICONDUCTOR MODULE

BACKGROUND OF THE INVENTION

Field of the Invention

The invention lies in the semiconductor technology field. More specifically, the present invention relates to a circuit configuration of a semiconductor module, to which burn-in test signals from a burn-in test device can be applied.

The failure rate of semiconductor modules as a function of time is known to have a profile which is generally also referred to as "bathtub-shaped". The profile shape is explained as follows: After a large number of inherently identical semiconductor modules have been completed, a large proportion of these semiconductor modules fails up to a particular time T1, so that the failure rate is relatively high. After this time T1 has been reached, the failure rate remains at a low value until, after the semiconductor modules have been used for a relatively long time, they once more start to fail increasingly from an instant T2 on.

Hence, in order to prevent semiconductor modules which have just been completed from failing in the possession of the user after a relatively short time, that is to say before the time T1 has been reached, the manufacturer subjects the semiconductor modules to a burn-in test in which they are artificially aged, so that their "age" is beyond the time T1 following the burn-in test. The burn-in test is intended to sort out those semiconductor modules which fail after only a short time, so that the user obtains only semiconductor modules which are aged beyond the time T1.

In order to age a semiconductor module artificially, a higher voltage is applied to it in the burn-in test. The higher voltage causes the semiconductor module to age artificially relatively quickly, so that the aging process reaches the time T1, even though only a short time period has actually elapsed. Moreover, during such a burn-in test, test signals are applied, on the basis of which a functional test of the semiconductor module is carried out and the functionality of the semiconductor module is tested during or after the artificial aging. Functional tests in the context of a burn-in test have the specific object to identify defective functions of the semiconductor module which are caused by individual premature failures.

The receptacles of the test arrangement, so-called burn-in boards, are subject to high temperature requirements and they age relatively quickly. over time this can lead to contact faults at terminals for burn-in test signals and/or burn-in voltages. It has been shown that in burn-in tests in so-called dynamic burn-in test arrangements in which alternating burn-in voltages and test signals are applied to the semiconductor module, the semiconductor modules are not subjected to a burn-in test reliably and correctly, on account of, for example, such contact problems exhibited by the receptacles of the semiconductor modules and the like.

In a prior, commonly assigned development, a semiconductor module for a burn-in test arrangement has been reviewed, in which it was possible to ascertain whether or not the semiconductor module has been in a so-called regulator-off test mode during the burn-in test with regard to the burn-in voltage, for example on account of defective contact connection. Integrated in that semiconductor module there is a component which, when the burn-in voltage is applied, after the burn-in time period has elapsed, has a different characteristic parameter when the regulator is turned off than when the regulator is turned on. The characteristic parameter used in that case is a degradation or deterioration of the component.

If, by way of an example, an address signal as one of the burn-in test signals is affected by a contact fault, this can mean that only a reduced address range of a semiconductor memory to be tested is subjected to a functional test. If the semiconductor memory operates without any faults within this tested address range, this is assessed as a positive test result. Since it has not been customary heretofore to test applied test signals in respect of their freedom from contact faults in such test configurations, it is assumed in such a case that the corresponding semiconductor module has been completely tested and that a situation exists which may be identified as freedom from faults.

For the aforementioned reasons, a burn-in test that has been performed does not lead to the underlying goal whereby exclusively defective semiconductor modules are identified as defective. It can happen, moreover, that defective semiconductor modules are classified as being functional.

SUMMARY OF THE INVENTION

The object of the invention is to provide a burn-in test circuit for a semiconductor component which overcomes the above-noted deficiencies and disadvantages of the prior art devices and methods of this kind, and which can be used to reliably test whether a complete burn-in test of the semiconductor module has taken place using all of the burn-in test signals that are to be applied to the semiconductor module.

With the above and other objects in view there is provided, in accordance with the invention, a circuit configuration for burn-in testing of a semiconductor module, comprising:
   a plurality of memory elements each having an input for receiving and storing therein respective burn-in test signals;
   a plurality of terminals for receiving the burn-in test signals from a burn-in test device, the signals having active and inactive states, each of the terminals being connected to an input of the memory elements for storing the respective burn-in test signal present at the terminal;
   each of the memory elements having an output outputting an output signal having an active state as soon as an active signal is present at the input of the memory element; and
   a functional unit connected to each of the memory elements, the functional unit having an output signal with a first state if all the memory elements output an active state output signal, and with a second state if at least one of the memory elements outputs an inactive state output signal.

In other words, the circuit configuration comprises a memory circuit with memory elements, at least one memory element being assigned to each terminal that receives a burn-in test signal and is connected to that terminal, for storage of the respective burn-in test signal that is present. If an active test signal is present, the corresponding memory element changes to the active state. The memory elements are connected to a functional unit, which, by means of its two states, indicates whether one of the connected memory elements has not changed to the active state. Testing in respect of whether one or a plurality of memory elements have received no active test signal is effected in this way. This indicates that a contact fault is present, if it is presupposed that, for a complete burn-in test, all of the test signals that are to be applied change to the active state at least once. Such information present at the output of the functional unit can be read out during or at the end of a burn-in test and be fed to an evaluation arrangement. The latter establishes whether the quality of the semiconductor module is downgraded or the semiconductor module is subjected to another burn-in test.

If, in a further assumed case, for example, a terminal for a data output of a semiconductor module to be tested is affected by an above-mentioned contact fault, as a consequence a fault-free test result yielded by a functional check cannot be read out. In this case, however, such a test result is assessed as erroneous, whereupon the tested semiconductor module is classified as defective, even though the situation of freedom from faults is inherently present.

In accordance with another feature of the invention, the circuit configuration for burn-in testing further comprises:

a test device for checking a functionality of a semiconductor module;

a memory device connected to the test device for storing test results, the memory device having a first state given the presence of at least one erroneous test result and a second state given a presence of fault-free test results;

a first programmable element connected to the functional unit for storing the state of the functional unit; and a second programmable element connected to the memory device for storing the state of the memory device;

the programmable elements each maintaining their storage state after an interruption in a voltage supply.

In other words, this development of the invention specifies a circuit configuration which can be used to reliably determine a result of a burn-in test. The circuit configuration additionally comprises a test device for checking the functionality of the semiconductor module, and also a storage device connected to the test device, for storage of test results. By way of example, the test device is a self-test device of the semiconductor module. The functional unit of the memory circuit is connected to a first programmable element, for storage of the state of the functional unit, and a second programmable element is connected to the storage device, for storage of the state of the storage device. The latter contains information about whether an erroneous test result is present during or after the checking of the semiconductor module.

In accordance with again an added feature of the invention, the programmable elements have connections interruptible by an energy beam. Alternatively, the programmable elements have electrically interruptible fuses.

Since the programmable elements each maintain their stored state after an interruption in the voltage supply, it is possible to dispense with the checking of the test results during or after the burn-in test with the same test arrangement. This prevents defective contact connection of the data terminals of the semiconductor module from leading to the quality of the latter being downgraded. The information about the functionality of the semiconductor module can be evaluated after the burn-in test in a further test arrangement, in which freedom from contact faults is ensured. By storing the state of the functional unit of the memory circuit, it is possible to use the same test arrangement to ascertain whether a complete burn-in test has taken place. These items of information lead to exclusively defective semiconductor modules being identified as defective and functional semiconductor modules being identified as free from faults.

In accordance with an added feature of the invention, the functional unit contains an AND gate.

In accordance with a preferred embodiment of the invention, the memory elements contain bistable multivibrators of an RS flip-flop type.

What is essential to the design of the memory elements is that when an active input signal is present, the memory elements store the signal until the information is read out and the memory elements are reset. This resetting takes place for example during the switching on of the power supply and subsequent initialization, so that the same starting conditions are provided for all the memory elements at the beginning of the burn-in test.

In accordance with again a further feature of the invention, there is provided a terminal connected to the programmable elements for connecting to and for evaluation of the burn-in test by an external evaluation device.

In accordance with a concomitant feature of the invention, the test device for checking the functionality of the semiconductor module contains a data compression circuit.

With the burn-in test signals, a number of criteria can be checked in respect of whether the test arrangement exhibits freedom from contact faults during a burn-in test: For example, monitoring is effected to see whether the corresponding burn-in test modes are activated, whether an individual address bit changes over once or a number of times, whether testing is effected for long enough at elevated voltage, whether every essential command is carried out during a burn-in test, and/or whether the voltage and the temperature are elevated as intended. Accordingly, test mode signals, address signals, data signals, clock signals and/or control signals for a burn-in test are connected to the semiconductor modules to be tested.

To ensure that the information stored in the programmable elements is maintained after an interruption in the voltage supply, it is advantageous for them to have connections that can be interrupted by an energy beam. These connections may be designed as so-called laser fuses or as electrically interruptible fuses. In the latter case, programming can be carried out with the aid of an on-chip drive arrangement for programming the electrically interruptible fuses without the assistance of external devices. Said drive arrangement is in turn controlled for example by a control circuit which evaluates the information of the functional unit of the memory circuit or the storage device for storing the test results.

In accordance with again another feature of the invention, the memory device receives a plurality of successive test results and the memory device changes to the first state as soon as an erroneous test result is present. In this simple design of the storage device it is provided that, in the event of a plurality of test results that are present one after the other, the memory device changes to a corresponding state as soon as an erroneous test result is present. A so-called summed pass-fail result is arrived at in this way.

In order to accelerate the checking during or after an burn-in test, by way of example, a data compression circuit of a known type is provided in the test device for checking the functionality of the semiconductor module. In this case, the test data are combined in groups, so that, especially in the case of the application for memory modules, such as for SDRAMs with a large memory area to be tested, a reduced address range is obtained and the test time is thereby shortened.

The quality control that follows a burn-in test evaluates the information—stored in the programmable elements—about terminals of the semiconductor components for example with the aid of an external evaluation apparatus. The auxiliary means required for this purpose are generally not subject to such high requirements as burn-in test systems, so that the problem of faulty contacts in their case is generally not critical. Therefore, it is with high probability that the evaluation result corresponds to the test result that is actually present.

Other features which are considered as characteristic for the invention are set forth in the appended claims.

Although the invention is illustrated and described herein as embodied in a circuit configuration for the burn-in test of a semiconductor module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
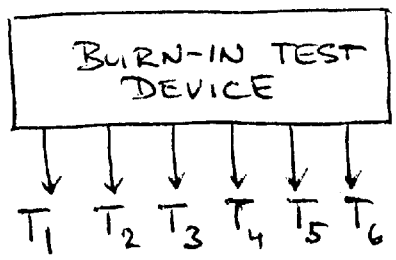
FIG. 1 is a circuit diagram of a configuration with a memory circuit which stores states of test signals that are present in memory elements.
Figure 1:
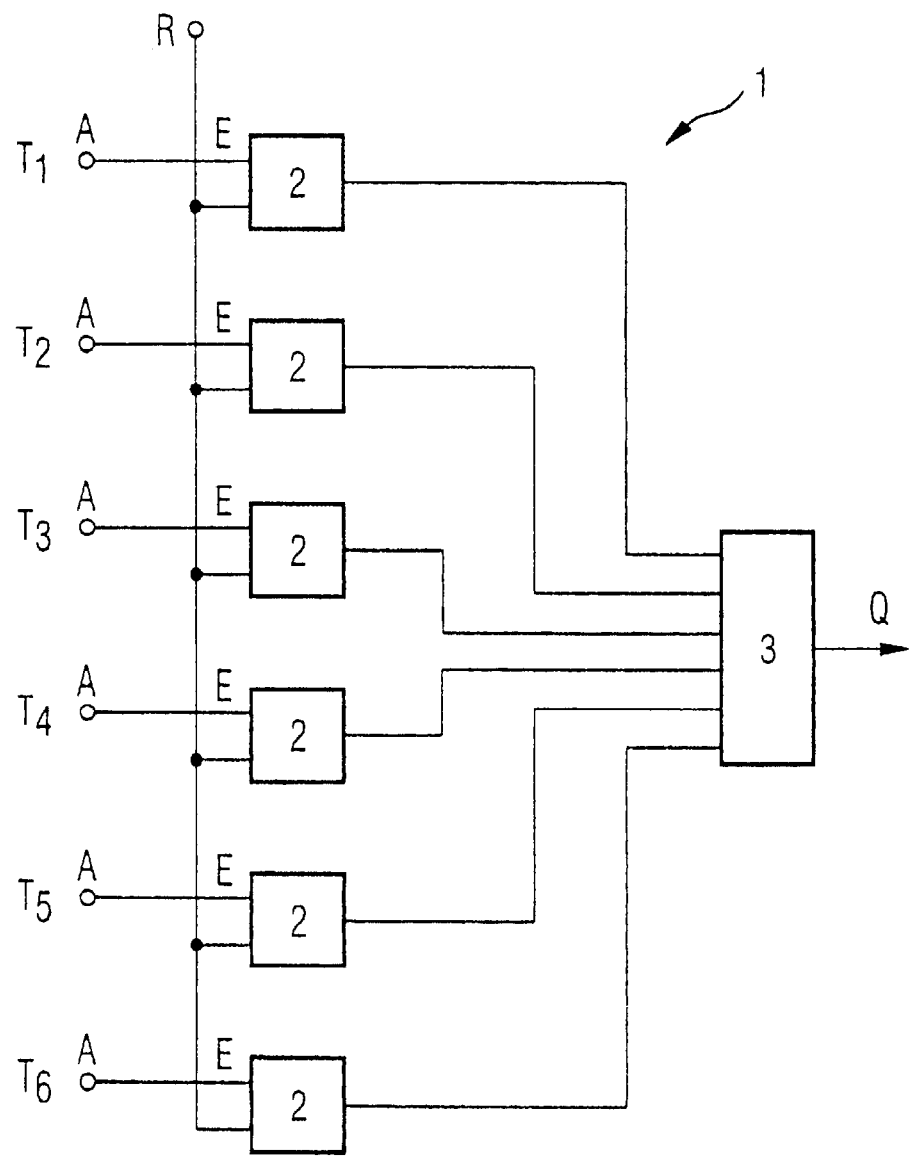

Referring now to the figures of the drawing in detail and first, particularly, to FIG. 1 thereof, there is seen a memory circuit 1 with terminals A, to which an exemplary number of burn-in test signals T1 to T6 from a burn-in test device can be applied. Furthermore, the circuit includes memory elements 2 and each terminal for a burn-in test signal T1 to T6 is assigned a respective memory element 2. The respective memory element 2 is connected to the terminal A of the corresponding test signal T1 to T6 via the input E, for storage of the respective burn-in test signal T1 to T6 that is present. Each of the memory elements 2 has the property whereby the output signal of the memory element 2 has an active state as soon as an active signal is present at the input of the memory element 2. That signal is stored until the content of all the memory elements 2 that are present is reset with the reset signal R.

The outputs of the memory elements 2 are connected to a functional unit 3. An output signal Q of the functional unit 3 has a first state, if all the connected memory elements are in the active state, and a second state, if at least one connected memory element 2 is in an inactive state. The state of the functional unit 3 can be gathered from the output signal Q at the output of the functional unit 3.

Figure 3:
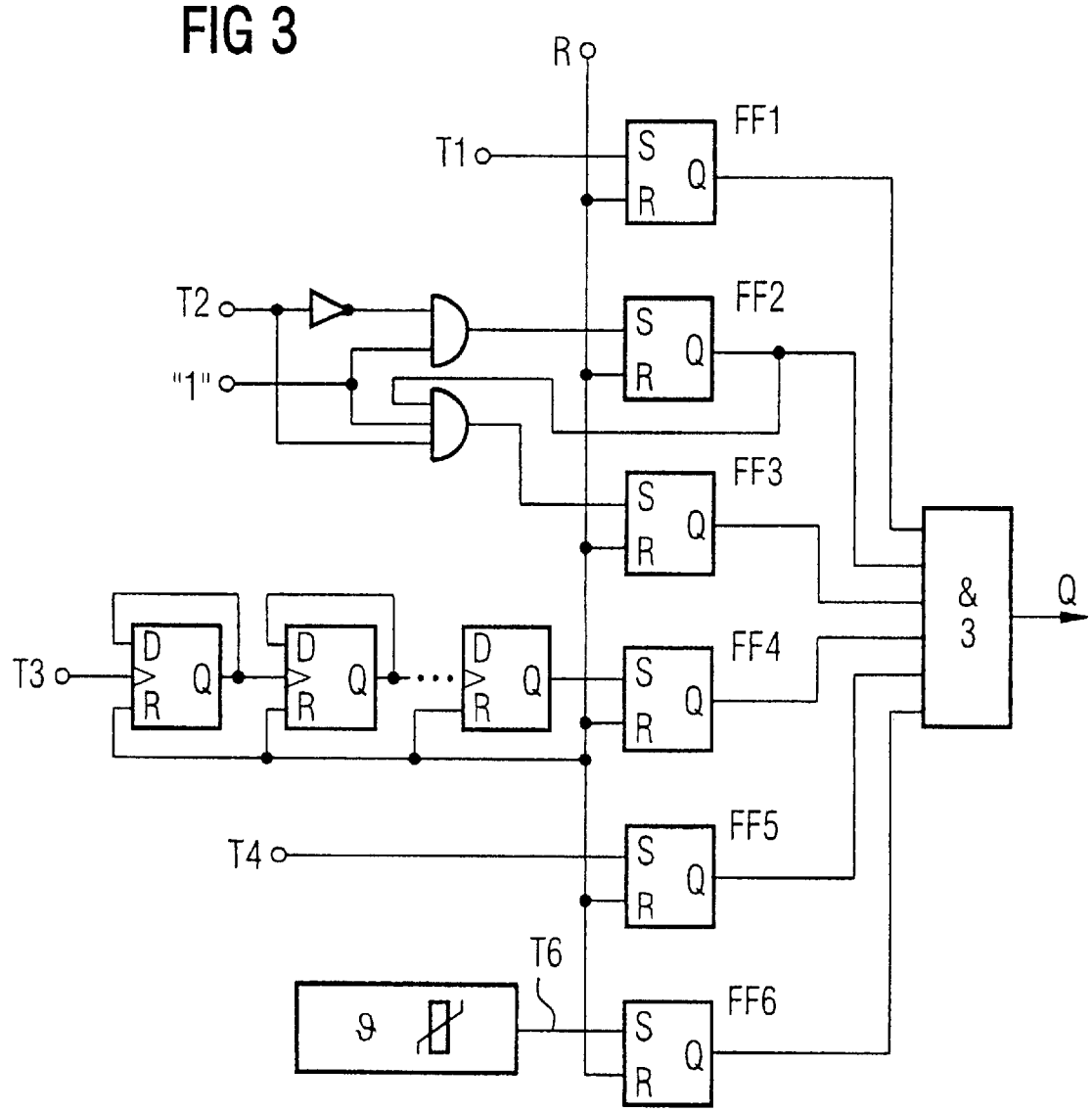
FIG. 3 is a diagram of an embodiment of a memory circuit according to FIG. 1.

Referring now to FIG. 3, there is shown an embodiment of the memory circuit 1 illustrated in FIG. 1. The memory elements 2 are all designed as bistable multivibrators of the RS flip-flop type. Their outputs are connected in the functional unit 3. In the embodiment of FIG. 3, the functional unit 3 is an AND gate. The respective test signals T1 to T6 are present at the respective input E of the RS flip-flops. Proceeding from the reset state of the memory elements 2, the latter change to an active state as soon as the corresponding test signals T1 to T6 have assumed an active state at least once. The test signal T1, which in this case constitutes one of a plurality of possible test mode signals, is connected to the memory element FF1. The memory elements FF2 and FF3 are connected to the test signal T2 in such a way that both signal transitions of T2 from an inactive state to an active state and vice versa are registered. This is necessary particularly in the case of address signals, which contain an item of address information both in the state "log. 0", which in this case corresponds to the inactive state for example, and the state "log. 1", which in this case corresponds to an active state. The test signal T3—corresponding, in this case, to an internal clock signal for example—is connected to the memory element FF4 via a frequency divider chain. With the aid of the frequency divider chain, it is possible for example to check a minimum test duration, depending on the length of the frequency divider chain. One of a plurality of test commands is stored in the memory element FF5 by means of the test signal T4. Finally, in this example, the temperature is monitored by means of a temperature sensor by means of the signal T6. However, this signal, in particular, can also be monitored by the burn-in test device itself, so that this circuit section may be additionally provided.

Figure 2:
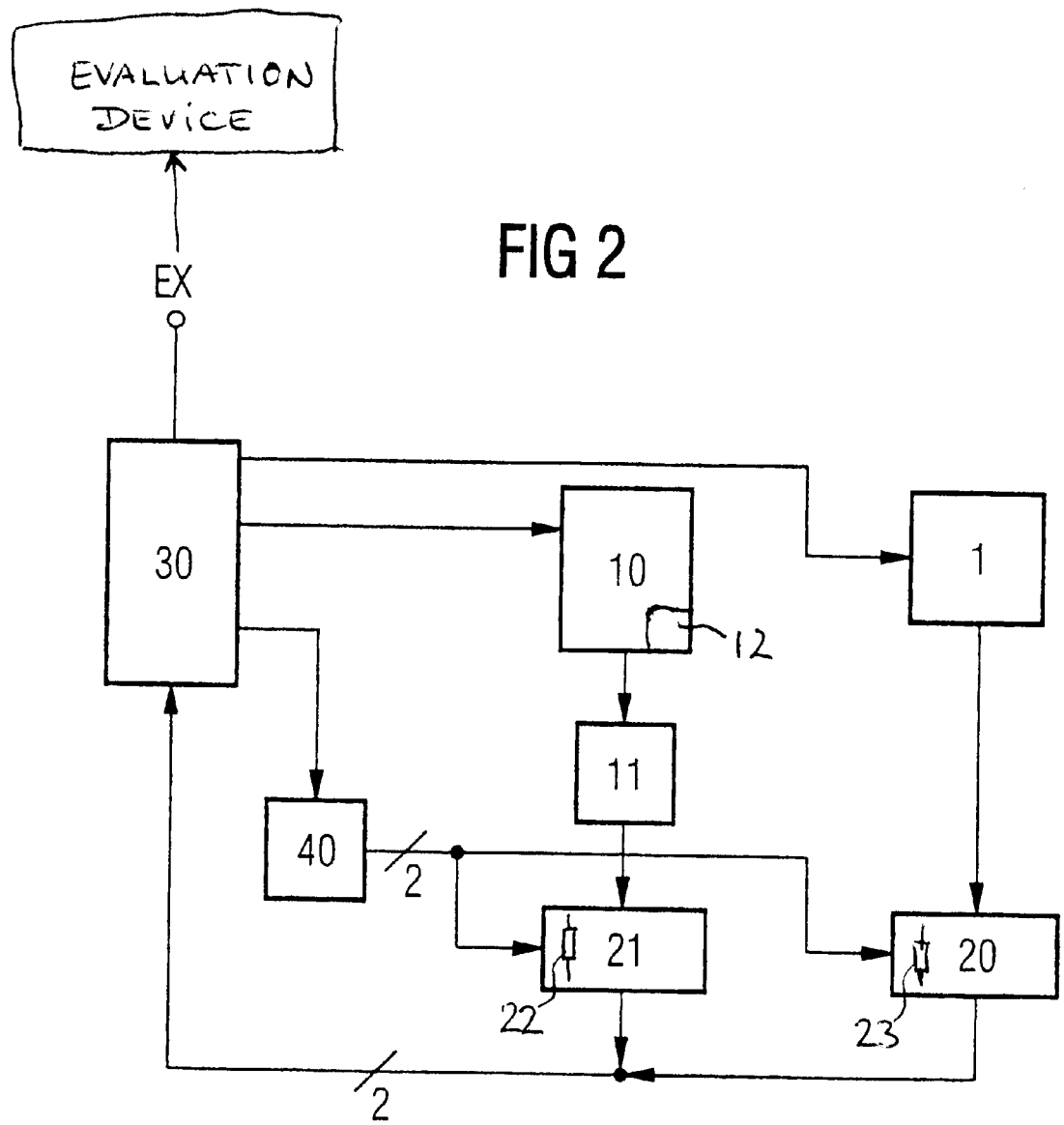
FIG. 2 is a block diagram of a circuit configuration of a semiconductor module with a memory circuit according to FIG. 1 and with programmable elements.

Referring now to FIG. 2, there is shown a circuit configuration of a semiconductor module with a memory circuit 1 according to FIG. 1. Also illustrated is a test device 10, which checks the functionality of the semiconductor module. The test device 10 is connected to the memory device 11, for storage of the test results determined by the test device 10. The test device 10 for checking the functionality of the semiconductor module, in a preferred embodiment, contains a data compression circuit 12. At its output, the storage device 11 has a first state given the presence of at least one erroneous test result and a second state given the presence of error-free test results. The memory circuit 1 and the storage device 11 are connected to a first programmable element 20 and a second programmable element 21, respectively, for storage of the respective state that is present. In a preferred embodiment, the programmable elements 20, 21 have connections that are interruptible by an energy beam (e.g., laser programmable links) or they are provided with electrically interruptible fuses. These programmable connections are indicated by the elements 22 and 23. The elements 20, 21 maintain the stored state even in the event that the supply voltage is interrupted. The outputs of the elements 20 and 21 are connected to a control circuit 30, which, on the one hand, forms an external interface to outside the semiconductor module and on the other hand controls the test sequence together with the test device 10 and the memory circuit 1.

If, by way of example, a semiconductor module is subjected to a burn-in test, the control circuit 30 transmits address signals and control signals to the test device 10. With the aid of an internal data generator, the test device 10 writes data to the memory cells of the memory cell array and compares the written data with the data read from the memory cell array. Using that comparison, an item of so-called pass-fail information is written to the memory device 11. If a plurality of test results are present one after the other, the memory device changes to a first state as soon as an erroneous test result is present. In the case of error-free checking and in the case where the memory circuit 1 has an active state, which means that all of the burn-in test signals that are to be applied are contact-connected entirely satisfactorily, the programmable element 20 and the programmable element 21 are programmed by means of the control circuit 30, which, for its part, drives a driver 40 for programming the programmable elements 20 and 21. After a burn-in test, the programmed states of the programmable elements 20 and 21 can be passed via the control circuit 30 to an external evaluation device for evaluation of the test results. The evaluation device being connected to the control circuit 30 via the terminal EX.

I claim:

1. A circuit configuration for burn-in testing of a semiconductor module, comprising:

a plurality of memory elements each having an input for receiving and storing therein respective burn-in test signals;

a plurality of terminals for receiving the burn-in test signals from a burn-in test device, the signals having active and inactive states, each of said terminals being connected to an input of said memory elements for storing the respective burn-in test signal present at said terminal;

each of said memory elements having an output outputting an output signal having an active state as soon as an active signal is present at said input of said memory element; and a functional unit connected to each of said memory elements, said functional unit having an output signal with a first state if all said memory elements output an active state output signal, and with a second state if at least one of said memory elements outputs an inactive state output signal.

2. The circuit configuration according to claim 1, wherein said functional unit contains an AND gate.

3. The circuit configuration according to claim 1, wherein said memory elements contain bistable multivibrators of an RS flip-flop type.

4. The circuit configuration according to claim 1, wherein the burn-in test signals are signals selected from the group consisting of test mode signals, address signals, data signals, clock signals, and control signals for a burn-in test.

5. The circuit configuration according to claim 1, which comprises:

a test device for checking a functionality of a semiconductor module;

a memory device connected to said test device for storing test results, said memory device having a first state given the presence of at least one erroneous test result and a second state given a presence of fault-free test results;

a first programmable element connected to said functional unit for storing the state of said functional unit; and a second programmable element connected to said memory device for storing the state of said memory device;

said programmable elements each maintaining their storage state after an interruption in a voltage supply.

6. The circuit configuration according to claim 5, wherein said programmable elements have connections interruptible by an energy beam.

7. The circuit configuration according to claim 6, wherein said programmable elements have electrically interruptible fuses.

8. The circuit configuration according to claim 5, wherein said memory device receives a plurality of successive test results and said memory device changes to the first state as soon as an erroneous test result is present.

9. The circuit configuration according to claim 5, which comprises a terminal connected to said programmable elements for connecting to and for evaluation of the burn-in test by an external evaluation device.

10. The circuit configuration according to claim 5, wherein said test device for checking the functionality of the semiconductor module contains a data compression circuit.

* * * * *